United States Patent
Guedon et al.

(10) Patent No.: US 9,019,229 B2
(45) Date of Patent: Apr. 28, 2015

(54) SAMPLE AND HOLD CAPACITANCE TO DIGITAL CONVERTER

(75) Inventors: Yannick Guedon, Mimosa Park (SG); Kien Beng Tan, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 343 days.

(21) Appl. No.: 12/732,581

(22) Filed: Mar. 26, 2010

(65) Prior Publication Data
US 2011/0234528 A1 Sep. 29, 2011

(51) Int. Cl.
G06F 3/044 (2006.01)
H03M 11/20 (2006.01)
G06F 3/041 (2006.01)
H03M 3/00 (2006.01)

(52) U.S. Cl.
CPC ............. H03M 11/20 (2013.01); G06F 3/0416 (2013.01); G06F 3/044 (2013.01); *H03K 2217/960725* (2013.01); *H03M 3/43* (2013.01)

(58) Field of Classification Search
CPC ..... G06F 3/0418; G06F 3/0416; G06F 3/041; G06F 3/044
USPC .............. 341/111–117, 122, 22, 33; 345/174; 178/18.06; 324/658
See application file for complete search history.

(56) References Cited

U.S. PATENT DOCUMENTS

| | | | |
|---|---|---|---|
| 5,854,625 A | 12/1998 | Frisch et al. | |
| 6,075,520 A * | 6/2000 | Inoue et al. | 345/173 |
| 6,452,514 B1 * | 9/2002 | Philipp | 341/33 |
| 2005/0238123 A1 * | 10/2005 | Ranganathan et al. | 375/343 |
| 2007/0062739 A1 * | 3/2007 | Philipp et al. | 178/18.06 |
| 2007/0159184 A1 * | 7/2007 | Reynolds et al. | 324/662 |
| 2007/0200833 A1 * | 8/2007 | Park et al. | 345/173 |
| 2008/0007534 A1 | 1/2008 | Peng et al. | |
| 2008/0142281 A1 * | 6/2008 | Geaghan | 178/18.06 |
| 2009/0244014 A1 | 10/2009 | Hotelling et al. | |
| 2009/0322410 A1 | 12/2009 | David et al. | |
| 2010/0097077 A1 | 4/2010 | Philipp et al. | |
| 2011/0007019 A1 * | 1/2011 | Tasher | 345/174 |

FOREIGN PATENT DOCUMENTS

WO WO 2009016382 A2 * 2/2009 ............. G06F 3/044

OTHER PUBLICATIONS

Lei, S et al., *An Oversampled Capacitance-to-Voltage Converter IC With Application to Time-Domain Characterization of MEMS Resonators*, IEEE Sensors Journal, vol. 5, No. 6, Dec. 2005, pp. 1353-1361.

* cited by examiner

Primary Examiner — Alexander S Beck
Assistant Examiner — Amen Bogale
(74) Attorney, Agent, or Firm — Gardere Wynne Sewell LLP

(57) ABSTRACT

A circuit for converting charge measured from a touch screen into a digital signal can include a sample and hold circuit. The sample and hold circuit can sample and integrate a charge from a capacitive sense matrix, and hold a voltage signal representing the measured charge. A sigma delta converter can convert the voltage into a digital value.

15 Claims, 5 Drawing Sheets

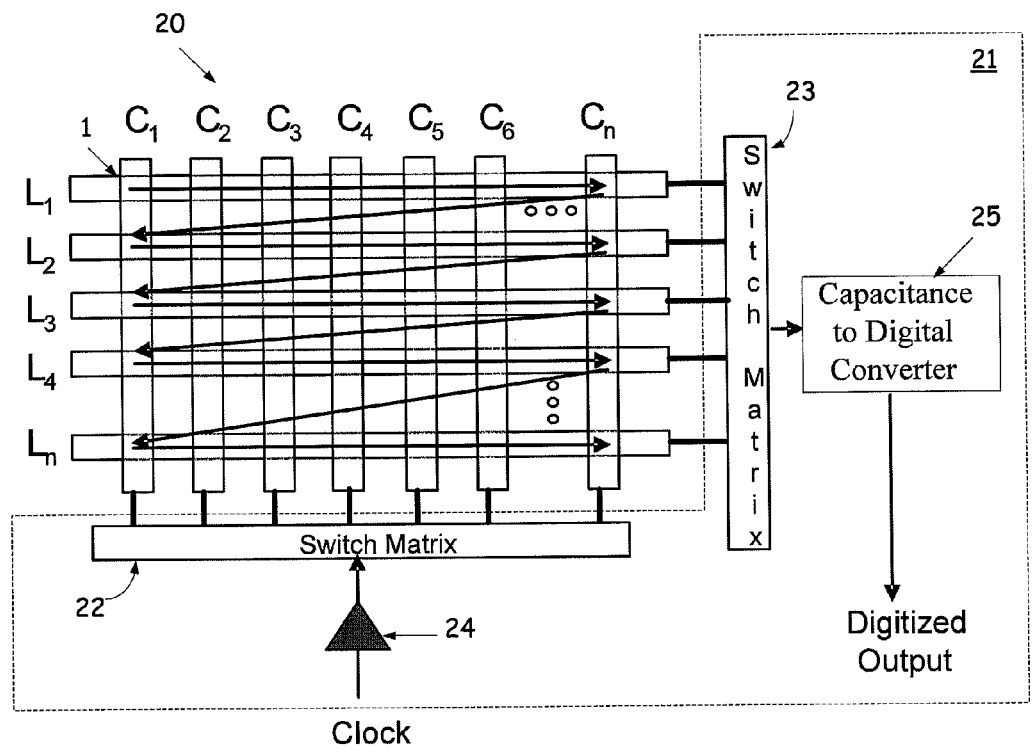
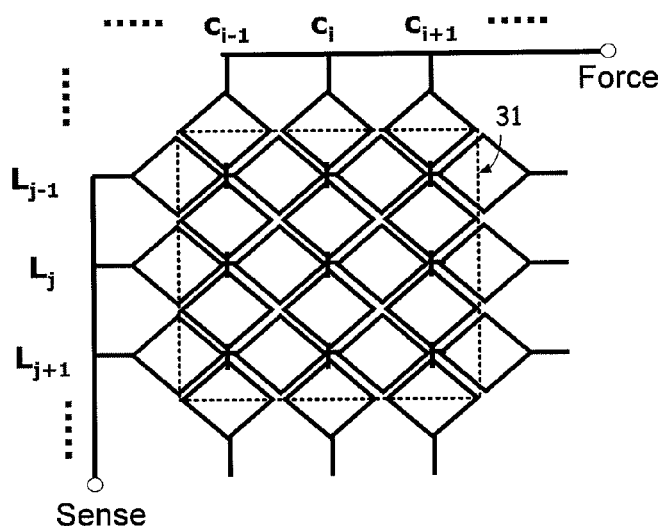
FIG. 3

SAMPLE AND HOLD CAPACITANCE TO DIGITAL CONVERTER

BACKGROUND

1. Technical Field

The techniques described herein relate generally to capacitive measurement and more specifically to touch and proximity detection using a touch screen having a capacitive sense matrix.

2. Discussion of the Related Art

A touch screen is a device that can detect an object in contact with a display area or in the proximity of the display area. The display area can be covered with a touch-sensitive matrix that can detect a user's touch by way of a finger or stylus, for example. Touch screens are used in various applications such as mobile phones and other mobile devices. A touch screen may enable various kinds of user input, such as touch selection of items on the screen or alphanumeric input via a displayed virtual keypad. Touch screens can measure various parameters of the user's touch, such as the location, duration, etc.

One type of touch screen is a capacitive touch screen. A capacitive touch screen may include a matrix of conductive lines and columns overlaid on the display area. The capacitance between each line and column of the matrix may be measured. A change in capacitance between a line and column can indicate that an object, such as a finger, is touching the screen near the region of intersection of the line and column.

SUMMARY

Some embodiments relate to a circuit for converting a measured charge into a digital signal. The circuit may include a sample and hold circuit configured to sample a charge from a capacitive sense matrix and hold a signal representing the charge for a first period of time. The circuit may also include an analog to digital converter that converts the signal into a digital value during the first period of time.

Some embodiments relate to a method of converting a measured charge into a digital signal. A charge may be sampled from a capacitive sense matrix. The charge may be integrated to produce a voltage. The voltage may be stored for a period of time and converted into a digital value during the first period of time.

This summary is presented by way of illustration and is not intended to be limiting.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

In the drawings, each identical or nearly identical component that is illustrated in various figures is represented by a like reference character. For purposes of clarity, not every component may be labeled in every drawing.

FIG. 2 shows a block diagram of a detection system that includes a capacitive sense matrix and a readout circuit.

FIG. 3 shows a capacitive sense matrix in which three lines and three columns are selected for in a proximity detection mode.

DETAILED DESCRIPTION

Described herein are inventive techniques for touch and/or proximity detection that may be used for a variety of devices such as touch screens. In some embodiments, a measurement may be made from a capacitive touch screen by integrating measured charge into a voltage value, storing the voltage, and converting the stored voltage into a digital value. For example, the charge measurement and conversion may be performed using an integrating sample and hold circuit and a sigma delta converter. The embodiments disclosed herein can overcome various problems with conventional capacitive touch screen measurement techniques.

Figure 1A:
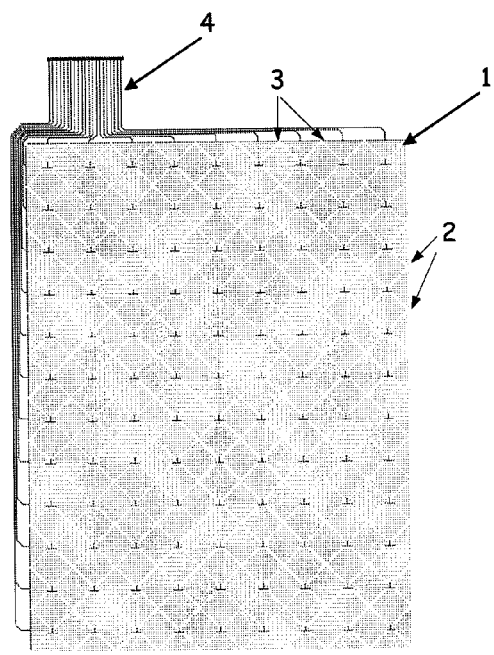
FIG. 1A shows an example of a capacitive touch screen.

FIG. 1A shows an example of a capacitive touch screen having conductive lines 2 and columns 3 of a capacitive sense matrix 1 arranged in a diamond pattern. The capacitive sense matrix 1 may be transparent to allow light from an underlying display unit to pass through the capacitive sense matrix 1 for viewing by a user. FIG. 1A also shows that a plurality of conductors 4 may be provided for making contact to the conductive lines 2 and columns 3. The conductive lines 2 and columns 3 may cover substantially the entire face of the capacitive touch screen, enabling touch and proximity detection at substantially any location on the capacitive touch screen.

Figure 1B:
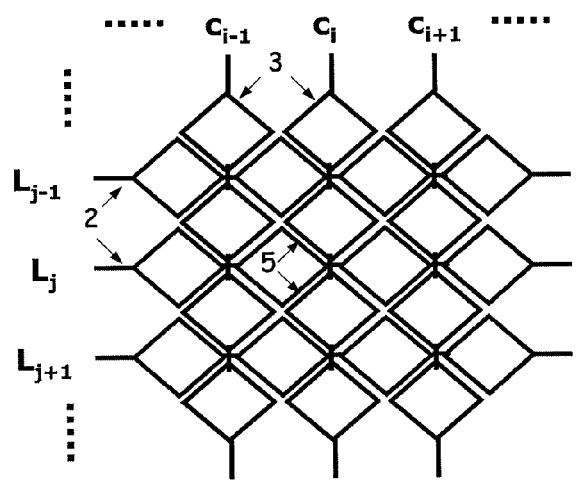
FIG. 1B shows a capacitive sense matrix of a capacitive touch screen.

FIG. 1B shows the capacitive sense matrix 1 in further detail. The capacitive sense matrix 1 includes a plurality of conductive columns 3 (C) and a plurality of conductive lines 2 (L). The conductive columns 3 extend vertically and the conductive lines 2 extend horizontally in FIG. 1B. The conductive lines 2 and columns 3 cross above or below each other at their intersection point (as viewed from above) such that they are not in contact with one another. Each of the conductive lines 2 and columns 3 has conductors arranged in a diamond pattern. As a result, the line and column conductors 2, 3 can be separated from each other by capacitive gaps 5. The diamond pattern may provide for increased capacitance between the conductive lines 2 and columns 3. Capacitive sense matrix 1 may sense an object that modifies the fringing electric field above the capacitive gaps 5 when in contact with the screen or in the proximity of the screen.

Figure 1C:
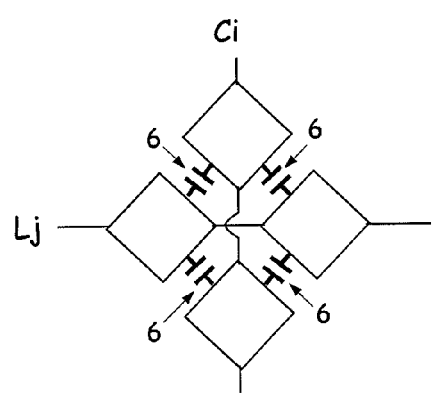
FIG. 1C shows the capacitance between a line and a column of the capacitive sense matrix.

FIG. 1C shows that when a conductive column $C_i$ and line $L_j$ are selected, the total capacitance between column $C_i$ and line $L_j$ is the sum of four capacitances 6 arising between the four adjacent diamond-shaped regions of column $C_i$ and line $L_j$. The capacitance between column $C_i$ and line $L_j$ can be measured to determine whether an object is in contact with or in the proximity of the touch screen above the region in which the four capacitances 6 are formed. Each conductive line 2 and column 3 of the capacitive sense matrix 1 may be selected in succession to measure the capacitances at each position on the touch screen 1.

FIG. 2 is a block diagram of a detection system 20 that includes the capacitive sense matrix 1 and an associated readout circuit 21, according to some embodiments. As discussed above, the capacitive sense matrix 1 may have a diamond pattern, though the diamond pattern is not shown in FIG. 2 for clarity. The readout circuit 21 includes a column switch matrix 22 and a line switch matrix 23 for selection of columns and lines of the capacitive sense matrix, respectively. The column switch matrix 22 may receive a clock signal from buffer 24 for timing the switch selection and scanning of the capacitive sense matrix 1. The line switch matrix 23 may select one or more lines for readout. The charge sensed from the capacitive sense matrix 1 may be converted into a digital value by capacitance to digital converter 25, as discussed further below.

FIG. 2 also shows an example of a scanning sequence that may be used to produce digital values representing the capacitances between the conductive lines and columns for multiple positions on the touch screen. The lines and columns may be scanned in any suitable manner. For example, the capacitance may be sensed between column $C_1$ and line $L_1$, then sensed between column $C_2$ and line $L_1$, and so on until column $C_n$ line $L_1$). The remaining lines may then be scanned sequentially. However, it should be appreciated that this is only an example of a suitable scanning sequence, and any suitable scanning sequence may be used.

At each scanning step, a measurement may be taken from the line/column pair that represents the capacitance between the selected line/column pair. For example, the capacitance between the selected line/column pair may be charged to a determined voltage value. The amount of charge stored depends on the capacitance between the line/column pair. The capacitance between the selected line and column may change when an object is touching the touch screen near the intersection area of the line and column and alters the electric field in this region. To determine whether an object is in the vicinity, the stored charge can be read out and converted into voltage that is then digitized.

In some embodiments, the capacitance between more than one line and/or column can be sensed at a time. Sensing the capacitance between more than one line and/or column at a time may enable increasing the sensitivity with which objects can be detected in the vicinity of the capacitive sense matrix. In one aspect, sensing the capacitance between more than one line and/or column at a time may enable detecting an object, such as a finger or stylus, that is in the proximity of the capacitances between the selected lines/columns even though the object may not be in contact with the touch screen. Thus, an approaching object may be detected when it comes within a small enough distance of the touch screen prior to the object coming into contact with the touch screen.

FIG. 3 shows a capacitive sense matrix in which three lines $L_{j-1}$, $L_j$ and $L_{j+1}$ and three columns $C_{i-1}$, $C_i$ and $C_{i+1}$ are selected at the same time to detect an object in the proximity of the area 31 of the capacitances between the selected rows and columns. For example, the selected columns may be connected together to a force node and the selected lines may be connected together to a sense node. Selecting multiple lines/and or columns at the same time may enable detecting an object with greater sensitivity, as the electric field established between the selected lines and columns may extend over a larger area than in the case when a single line and column are selected. Using this proximity detection technique, an object need not be touching the screen to be detected, and may be detected when it is near the screen. It should be appreciated that the selection of three lines and three columns is only an example according to some embodiments, and any suitable number of lines and/or columns may be selected at the same time in other implementations.

Selecting multiple lines and/or columns at the same time may increase the capacitance that is charged and discharged for each measurement. For example, when three lines and three columns are selected at the same time, the resulting capacitance between the three lines and three columns can be nine times higher than when a single line and column are selected. One consequence of the higher sensing capacitance used in proximity detection techniques is that it may take significantly more time to charge and/or discharge the capacitance when multiple lines and columns are selected. Another consequence of the higher sensing capacitance used in proximity detection is that it may store significantly more charge than in the case where only a single line and column are selected at a time. The capacitance to digital converter 25 may be adjusted appropriately for measuring different amounts of charge depending on the number of lines and columns selected, as discussed further below.

One problem with touch screens is that they can be sensitive to interference from the display circuitry. For example, liquid crystal displays (LCD) use a common reference voltage $V_{com}$ that may periodically switch values to maintain proper operation of the LCD display. Due to the proximity of the capacitive tough screen to the LCD display, a change in the $V_{com}$ voltage level may be picked up as noise in the capacitive sense matrix as a result of parasitic capacitance between the $V_{com}$ plane and the capacitive sense matrix. The $V_{com}$ noise can cause an erroneous charge value to be detected from the capacitive sense matrix.

A conventional solution is to insert a high conductivity transparent layer at ground potential between the $V_{com}$ plane and the capacitive sense matrix. The high conductivity transparent layer may act as a ground plane that shields the capacitive sense matrix from the $V_{com}$ signal. However, inserting the high conductivity transparent layer adds an additional layer to the device that may decrease the brightness of the display. Further, in some technologies the capacitive sense matrix and the display may be highly integrated, such that it is not feasible to physically shield the sense matrix from the display $V_{com}$ signal.

Figure 4:
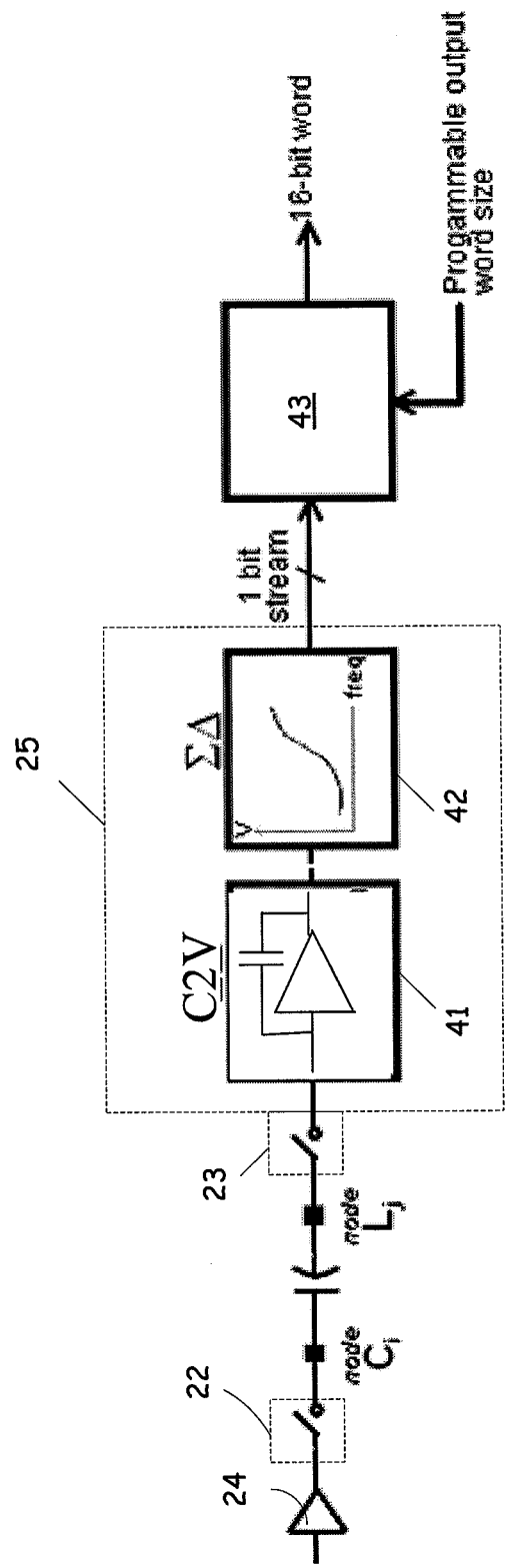
FIG. 4 shows a block diagram of a capacitance to digital converter according to some embodiments.

FIG. 4 shows a block diagram of a capacitance to digital converter 25 that can overcome the above-described drawbacks and other drawbacks of conventional touch pad capacitive sensing techniques, according to some embodiments. The capacitance to digital converter 25 includes a capacitance to voltage conversion sample and hold circuit 41 and an analog to digital converter such as a sigma delta converter 42. The capacitance to voltage conversion sample and hold circuit 41 may receive a charge from the capacitive sensing matrix and convert the charge into a voltage. The circuit 41 may store the voltage and provide it to the sigma delta converter 42 for analog to digital conversion. The sigma delta converter 42 may be operated as an oversampled sigma delta analog to digital converter that receives the measured voltage and converts it into a one-bit data stream having a bit density that is dependent on the measured voltage. The one-bit data stream may be decimated, filtered and converted into a digital word representing the detected voltage by digital signal processing circuit 43. Any suitable type of analog to digital converter may be used, as the techniques described herein are not limited to a sigma delta converter. It should be appreciated that any suitable processing may be performed on the one-bit data stream by digital signal processing circuit 43 and/or other processing module(s). By scanning the touch screen, digital values may be determined for each position on the touch screen, and these values may be processed to determine the user inputs applied to the touch screen.

Figure 5:
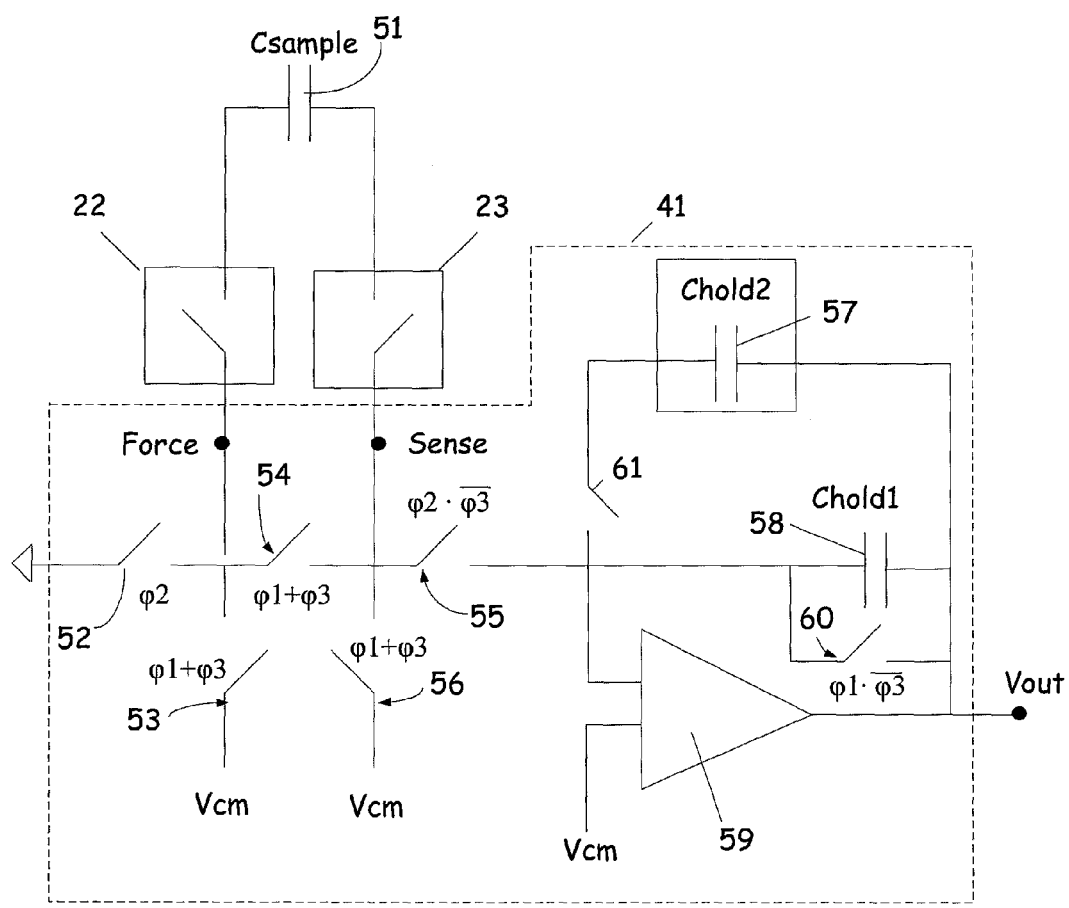
FIG. 5 shows a circuit diagram of an example of a capacitance to voltage conversion sample and hold circuit, in accordance with some embodiments.

FIG. 5 shows a circuit diagram of an example of a capacitance to voltage conversion sample and hold circuit 41, in accordance with some embodiments. $C_{sample}$ 51 represents the capacitance between the line(s) and column(s) of the capacitive sense matrix 1 selected by switch matrices 22 and 23. It should be appreciated that switch matrices 22 and 23 may each have multiple switches for selection of any line(s) and column(s). Circuit 41 includes switches 52-56 for charging $C_{sample}$ and reading out the measured charge. Circuit 41 also includes a first holding capacitor $C_{hold1}$ 58 and an optional additional holding capacitor $C_{hold2}$ 57 that may be configured to have different values. Circuit 41 further includes an operational amplifier 59 that may operate in conjunction with holding capacitors 57 and/or 58 to integrate the charge received from $C_{sample}$. The operational amplifier 59 may have a first input connected to switch 55 and the holding capacitor(s) and a second input connected to a constant voltage such as $V_{cm}$. Capacitor $C_{hold2}$ 57 may be connected in parallel with $C_{hold1}$ 58 to increase the amount of capacitance between the sense node and the $V_{out}$ node. The additional capacitance from $C_{hold2}$ 57 may be desirable when $C_{sample}$ has a larger value, such as when multiple lines and columns are selected in the capacitive sense matrix 1. Capacitor $C_{hold2}$ 57 may be connected in parallel with $C_{hold1}$ 58 by turning on switch 61. Circuit 41 may also include a switch 60 for resetting capacitor $C_{hold1}$ 58 and/or $C_{hold2}$ 57.

The capacitance to voltage conversion sample and hold circuit 41 may operate in three phases. During the three phases, the force node can be connected to the first terminal of $C_{sample}$ 51 by switch matrix 22 and the sense node can be connected to the second terminal of $C_{sample}$ 51 by switch matrix 23.

In the first phase φ1, $C_{sample}$ 51 may be re-set to the voltage $V_{cm}$ by turning on switches 53, 54, and 56 and turning off switches 52 and 55, such that both terminals of $C_{sample}$ 51 are at the voltage $V_{cm}$. Holding capacitor $C_{hold1}$ 58 may be reset by turning on switch 60, thereby shorting together the terminals of holding capacitor $C_{hold1}$ 58 and discharging any charge stored therein.

In the second phase φ2, the force node may be connected to a constant voltage node such as ground by turning on switch 52, and switches 53, 54 and 56 are turned off. The sense node is connected to the holding capacitor $C_{hold1}$ 58 and/or $C_{hold2}$ 57 and a first input of operational amplifier 59 by turning on switch 55, thereby transferring charge from $C_{sample}$ 51 to holding capacitor(s) $C_{hold1}$ 58 and/or $C_{hold2}$ 57. Switch 60 may be turned off during the second phase to enable accumulation of charge on $C_{hold1}$ 58 and/or $C_{hold2}$ 57. During the second phase, operational amplifier 59 and capacitor(s) $C_{hold1}$ 58 and/or $C_{hold2}$ 57 may act as an integrator that integrates the transferred charge into a voltage $V_{out}$. The voltage $V_{out}$ may be stored by holding capacitor(s) $C_{hold1}$ 58 and/or $C_{hold2}$ 57.

In the third phase φ3, the sigma delta converter 42 may convert the voltage at node $V_{out}$ into a 1 bit data stream representing the value of the voltage $V_{out}$. $C_{sample}$ 51 may be re-set to the voltage $V_{cm}$ by turning on switches 53, 54, and 56 and turning off switches 52 and 55. Switch 60 may remain off to maintain the voltage $V_{out}$ held by holding capacitor $C_{hold1}$ during the analog-to-digital conversion. In some embodiments, the sigma delta conversion may begin before the end of the second phase φ2 to avoid a drop in the output voltage of converter 41 when the sigma delta conversion begins.

Figure 6:
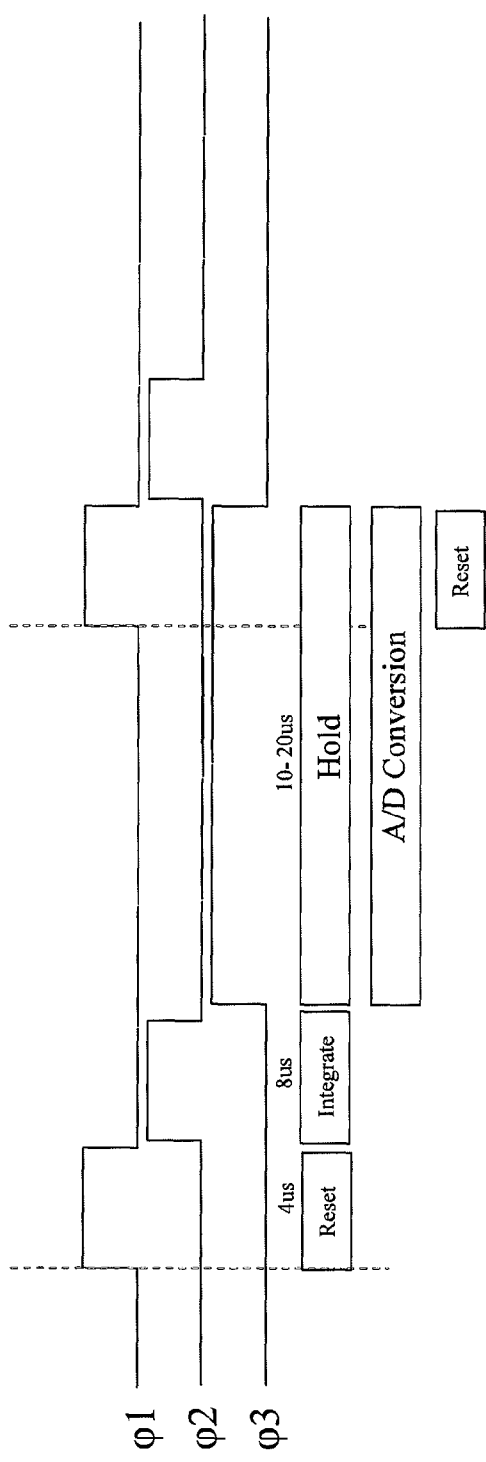
FIG. 6 shows a timing diagram illustrating phases of operation of the capacitance to voltage conversion sample and hold circuit, in accordance with some embodiments.

FIG. 6 is a timing diagram showing the timing of the three phases φ1, φ2 and φ3. FIG. 6 shows waveforms for each of phases φ1, φ2 and φ3 that indicate the start and end of each phase. A low-to-high waveform transition represents the start of a phase and a high-to low transition represents the end of a phase. In some embodiments, the first phase φ1 may last approximately 4 µs, the second phase φ2 may last approximately 8 µs, and the third phase φ3 may last from approximately 10-20 µs. Resetting $C_{sample}$ 51 may take approximately 4 µs and resetting $C_{hold}$ may take approximately 0.4 µs. However, it should be appreciated that these are examples, and other suitable phase timings may be used.

Applicants have recognized and appreciated that sigma delta converters may take a significant amount of time to convert a measured signal value into digital value. The charging and discharging of the capacitive sense matrix may also take a significant amount of time, particularly when multiple lines and columns are selected and a larger capacitance is charged/discharged. In some embodiments, the resetting of $C_{sample}$ 51 is performed concurrently with the end of the third phase φ3, as shown in FIG. 6. Switch 60 may be turned off during φ3, and then turned on briefly following φ3 to reset the holding capacitor(s) $C_{hold1}$ 58 and/or $C_{hold2}$ 57.

Advantageously, performing the resetting of $C_{sample}$ during the end of the A/D conversion phase φ3 can reduce the amount of time needed to scan the capacitive sense array.

In some embodiments, $C_{hold2}$ 57 may be an adjustable/programmable capacitance that can take on any of a range of values. $C_{hold2}$ 57 may include a plurality of capacitors that can be connected as desired to be in parallel with $C_{hold1}$ 58. Using an adjustable/programmable capacitance circuit may enable sensing a wider range of capacitance values $C_{sample}$ of the capacitive sense matrix. For example, a larger capacitance value may be used for $C_{hold2}$ 57 when the circuit is in a proximity detection mode in which multiple lines and columns are selected and $C_{sample}$ is large. A smaller capacitance value may be used when the circuit is in a touch detection mode in which only a single line and column are selected and $C_{sample}$ is small, enabling an improved dynamic range. The total value of the holding capacitors $C_{hold}$ may be set to be on the same order of magnitude as $C_{sample}$. For example, $C_{hold}$ and $C_{sample}$ may have the relationship $C_{hold}=C_{sample}/0.7$. The total capacitance value may be increased for proximity detection using selection of multiple lines and columns and decreased for touch detection in which only a single line and column are selected. In some implementations $C_{hold1}$ 58 itself may be adjustable.

Figure 7:
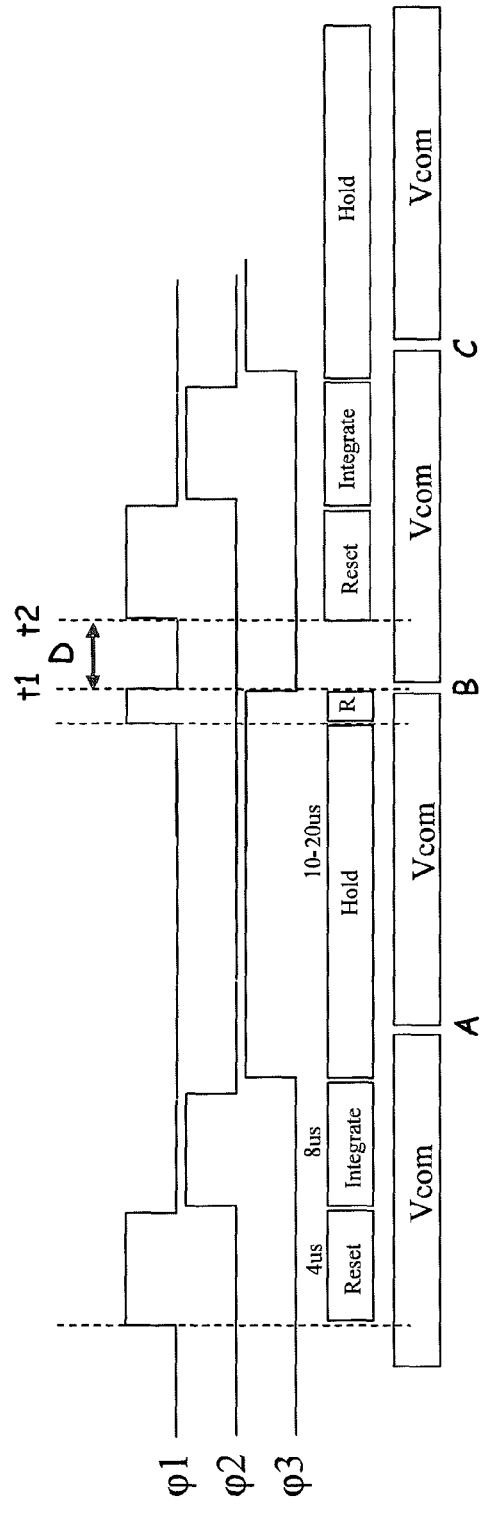
FIG. 7 shows another timing diagram illustrating phases of operation of the capacitance to voltage conversion sample and hold circuit that can avoid display $V_{com}$ signal interference, in accordance with some embodiments.

In some embodiments, the techniques described herein can prevent or reduce the effect of the noise from the display $V_{com}$ reference signal on the capacitive sensing matrix 1. FIG. 7 shows a timing diagram illustrating the phase timing of the readout circuit 21 and the timing of the switching of the $V_{com}$ signal. As shown in FIG. 7, the $V_{com}$ reference signal changes voltages at points A, B, and C during readout of the capacitive sense matrix. Using a sample and hold technique with suitable timing can reduce or eliminate the effect of the $V_{com}$ switching on the charge sampled from the capacitive sensing matrix 1.

For example, a detection circuit may be used to detect when the $V_{com}$ switching occurs. If the detection circuit detects that the $V_{com}$ reference signal is switching during φ1 or φ2, for example, the readout may be canceled and re-started at φ1 after a suitable delay period. FIG. 7 shows an example of how the phase timing may be altered when $V_{com}$ switching is detected. FIG. 7 shows that the $V_{com}$ signal switches at time t1. In response to detecting the $V_{com}$ signal switching, the readout of the capacitive sensing matrix may be canceled and restarted at time t2 after a suitable delay D. Other techniques may be used to avoid the effect of the $V_{com}$ switching. For example, in some embodiments the phase timing may be synchronized with the $V_{com}$ reference signal so as to avoid having the $V_{com}$ switching occur during ϕ1 or ϕ2. Advantageously, the effect of the $V_{com}$ switching can be avoided using proper timing of the readout circuit 21, which may eliminate the need for a ground plane between the $V_{com}$ plane and the capacitive sense matrix. However, these techniques may also be used in conjunction with a shielding ground plane if desired.

Some conventional readout techniques that use sigma delta converters may have high power consumption when the capacitive sense matrix is charged and discharged at the high oversampling frequency of the sigma delta converter. Advantageously, the techniques described herein may enable reducing the power consumption by sampling and holding the detected signal from the capacitive sense matrix. The sigma delta converter may operate on the stored voltage and need not charge and discharge the capacitive sense matrix at the oversampling frequency. Thus, the capacitive sense matrix can be isolated from the sigma delta converter during operation, which can enable lower power consumption.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A circuit for converting a quantity of charge into a digital value, the circuit comprising:
    a sample and hold circuit configured to sample the quantity of charge from a capacitive sense matrix, the sample and hold circuit comprising an integrator that receives the quantity of charge from the capacitive sense matrix and converts the quantity of charge into a voltage; and
    an analog to digital converter that converts the voltage into a digital value,
    wherein the integrator comprises an operational amplifier, a capacitor connected between an input terminal and an output terminal of the operational amplifier, and an additional capacitor connected to the output terminal of the operational amplifier,
    wherein the sample and hold circuit further comprises a switch in parallel with the capacitor to reset the capacitor, and an additional switch in series between the input terminal of the operational amplifier and the additional capacitor to connect the additional capacitor in parallel with the capacitor,
    wherein the switch in parallel with the capacitor is connected to the output terminal of the operational amplifier;
    wherein the integrator is isolated from the capacitive sense matrix while the analog to digital converter converts the voltage into the digital value, and
    wherein the circuit further comprises at least one switch that resets a voltage across a capacitance between one or more selected lines and one or more selected columns of the capacitive sense matrix while the analog to digital converter converts the voltage into the digital value.

2. The circuit of claim 1, wherein the capacitor has a capacitance value that is a same order of magnitude as the capacitance between one or more selected lines and one or more selected columns of the capacitive sense matrix.

3. The circuit of claim 1, wherein the sample and hold circuit further comprises an adjustable capacitor circuit.

4. The circuit of claim 1, wherein the analog to digital converter comprises a sigma delta converter that converts the voltage into the digital value.

5. The circuit of claim 1, wherein the capacitive sense matrix senses touch and/or proximity to a display screen.

6. The circuit of claim 5, wherein the circuit is configured such that the sample and hold circuit samples the quantity of charge during a period in which a reference voltage of the display screen is substantially constant, wherein the reference voltage creates a noise signal in the capacitive sense matrix when the reference voltage creates a noise signal in the capacitive sense matrix when the reference voltage changes values.

7. A method of measuring and converting a quantity of charge into a digital value, the method comprising:
    sampling the quantity of charge from a capacitive sense matrix;
    integrating the quantity of charge to produce a voltage using an integrator comprising an operational amplifier with a capacitor connected between an input terminal and an output terminal of the operational amplifier;
    storing the voltage using the capacitor;
    resetting the voltage across a capacitance between one or more selected lines and one or more selected columns of the capacitive sense matrix using at least one switch while converting the voltage into a digital value;
    isolating the integrator from the capacitive sense matrix while converting the voltage into a digital value;
    sharing charge between the capacitor and an additional capacitor by turning on a switch connecting the additional capacitor in parallel with the capacitor;
    resetting the capacitor by turning on a switch in parallel with the capacitor;
    detecting a change in a reference voltage of a display screen;
    sampling a second quantity of charge from the capacitive sense matrix; and
    canceling the sampling of the second quantity of charge from the capacitive sense matrix in response to the detecting of the change in the reference voltage.

8. The method of claim 7, wherein the sampling of the quantity of charge comprises setting the one or more selected columns to a first voltage and coupling the one or more selected lines to a readout circuit.

9. The method of claim 8, wherein the voltage is converted into a digital value using a sigma delta converter.

10. The method of claim 7, wherein the capacitive sense matrix senses touch and/or proximity to the display screen.

11. The method of claim 10, wherein the sampling of the quantity of charge is performed during a period in which the reference voltage of the display screen is substantially constant, wherein the reference voltage of the display screen is substantially constant, wherein the reference voltage creates a noise signal in the capacitive sense matrix when the reference voltage changes values.

12. The method of claim 7, further comprising: changing a capacitance value of a capacitive circuit in parallel with the capacitor.

13. The method of claim 12, wherein the capacitive sense matrix senses touch and proximity to a touch screen, and the method further comprises:
increasing the capacitance value to detect an object in the proximity of the touch screen;and decreasing the capacitance value to detect an object touching the touch screen.

14. A circuit for processing a signal from a capacitive sense matrix, the circuit comprising:
an integrator comprising an operational amplifier and a capacitor connected between an input terminal and an output terminal of the operational amplifier, and an additional capacitor connected to the output terminal of the operational amplifier;
at least one first switch configured to provide a quantity of charge from a sense node of the capacitive sense matrix to the integrator, wherein the integrator is configured to convert the quantity of charge into a voltage;
an analog to digital converter that converts the voltage into a digital value;
at least one switch in parallel with the capacitor to reset the capacitor; and
an additional switch in series between the input terminal of the operational amplifier and the additional capacitor to connect the additional capacitor in parallel with the capacitor,
wherein the at least one switch in parallel with the capacitor is connected to the output terminal of the operational amplifier,
wherein the integrator is isolated from the capacitive sense matrix while the analog to digital converter converts the voltage into the digital value,
wherein the circuit further comprises at least one second switch that resets a voltage across a capacitance between one or more selected lines and one or more selected columns of the capacitive sense matrix while the analog to digital converter converts the voltage into the digital value.

15. The method of claim 7, the method further comprising delaying a start of a sampling of a third quantity of charge from the capacitive sense matrix.

* * * * *